United States Patent
Yeh

(10) Patent No.: US 8,724,328 B2
(45) Date of Patent: May 13, 2014

(54) ELECTRONIC DEVICE AND SOLID STATE DISK MODULE THEREOF

(75) Inventor: Yin-Ting Yeh, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 534 days.

(21) Appl. No.: 13/071,469

(22) Filed: Mar. 24, 2011

(65) Prior Publication Data
US 2012/0170202 A1 Jul. 5, 2012

(30) Foreign Application Priority Data
Dec. 31, 2010 (TW) .................................. 99147083

(51) Int. Cl.
*H05K 7/20* (2006.01)
(52) U.S. Cl.
USPC ......................................... 361/720; 361/810
(58) Field of Classification Search
CPC .............................. B01D 29/52; H05K 7/1487
USPC ................... 361/807, 809, 810, 720
See application file for complete search history.

(56) References Cited

U.S. PATENT DOCUMENTS

| | | | | |
|---|---|---|---|---|
| 5,788,211 A | * | 8/1998 | Astier | 248/674 |
| 7,095,626 B2 | * | 8/2006 | Seidler | 361/816 |
| 7,768,789 B2 | * | 8/2010 | Ni et al. | 361/737 |
| 8,040,670 B2 | * | 10/2011 | Tatsukami | 361/679.31 |
| 8,300,347 B2 | * | 10/2012 | Honda | 360/66 |
| 8,358,513 B2 | * | 1/2013 | Kim | 361/807 |

FOREIGN PATENT DOCUMENTS

| | | |
|---|---|---|
| JP | 2001-148186 A | 5/2001 |
| TW | M366151 U1 | 10/2009 |

* cited by examiner

*Primary Examiner* — Hung S Bui
(74) *Attorney, Agent, or Firm* — Novak Druce Connolly Bove + Quigg LLP

(57) ABSTRACT

An exemplary electronic device includes a shell, a printed circuit board and a solid state disk module provided in the shell. The printed circuit board has a cable. The solid state disk module includes a solid state disk and a fixing structure encapsulating the solid state disk. The solid state disk has ports connected with the cable. The fixing structure includes a bottom panel, a top panel extending from one end of the bottom panel and two lateral panels extending from two lateral sides of the bottom panel. The bottom panel supports the solid state disk. The top panel is bent from the bottom panel and covers the end and a top of the solid state disk. The lateral panels are bent from the bottom panel and cover the solid state disk and connect to the top panel. A handle portion extends beyond the top of the solid state disk.

18 Claims, 3 Drawing Sheets

ELECTRONIC DEVICE AND SOLID STATE DISK MODULE THEREOF

BACKGROUND

1. Technical Field

The present disclosure relates generally to electronic devices, and more particularly to an electronic device having a solid state disk module.

2. Description of Related Art

Solid state disks for storing information provide advantages such as fast reading, compactness, and little or no noise or vibration. Thus, solid state disks used in electronic devices provide an effective, high quality alternative to ordinary disks. For instance, a solid state disk is usually used in a server as a data backup storage media. A fixing structure is needed to secure the solid state disk in the server. Currently, fixing structures in use have disadvantages such as a complicated construction, high cost, and susceptibility to damage if operated improperly.

What is needed, therefore, is an improved electronic device having a fixing structure for a solid state disk which can overcome the above-mentioned limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
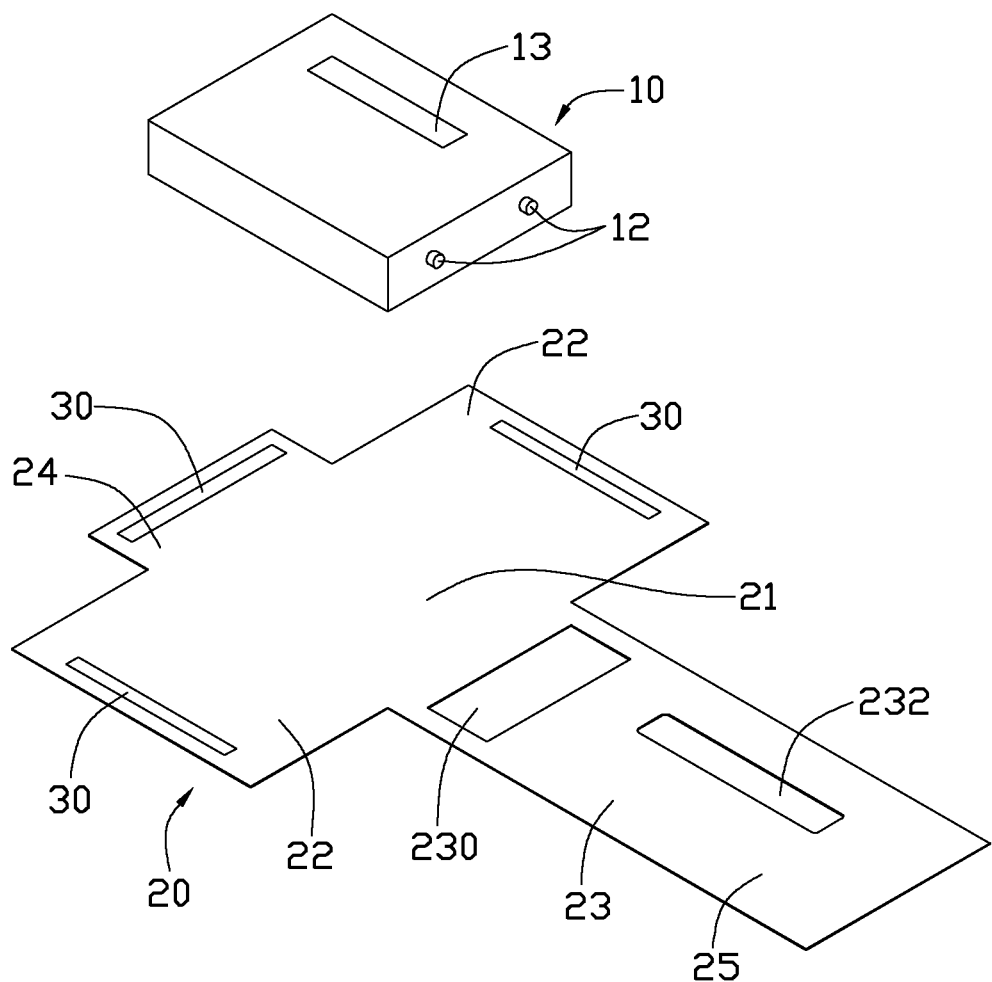
FIG. 1 is an isometric, exploded view of a solid state disk module in accordance with an embodiment of the present disclosure.

Referring to FIG. 1, a solid state disk module in accordance with an embodiment of the present disclosure comprises a solid state disk 10 and a fixing structure 20 encapsulating the solid state disk 10.

Two ports 12 are formed on one end of the solid state disk 10, and are adapted for connecting with data lines (not shown) for information transmission. The number of ports 12 can be configured to meet different requirements. A specially designated portion such as a label portion 13 is defined in a top surface of the solid state disk 10.

The fixing structure 20 may be made of insulating material such as plastic, and can be made by stamping or shearing. In this embodiment, the fixing structure 20 is integrally formed as a single monolithic piece of the same material by stamping. The fixing structure 20 comprises a bottom panel 21, two lateral panels 22, a top panel 23, and a securing panel 24. The lateral panels 22 extend from two opposite lateral sides of the bottom panel 21. The top panel 23 extends from one end (such as the rear end) of the bottom panel 21. The securing panel 24 extends from an opposite end (such as the front end) of the bottom panel 21. A hole 230 is defined in a portion of the top panel 23 adjacent to the bottom panel 21, for extension of the ports 12 of the solid state disk 10 therethrough.

Adhesive material 30 is mounted on the lateral panels 22 and the securing panel 24. Specifically, the adhesive material 30 is provided in the form of strips, which are positioned at outer edges of the lateral and securing panels 22, 24, respectively. The adhesive material 30 may be glue, adhesive tape, etc.

A window 232 is defined in the top panel 23 of the fixing structure 20, corresponding to the label portion 13 of the solid state disk 10. When the top panel 23 covers the solid state disk 10, information of the label portion 13 can be seen through the window 232.

Specifically, the top panel 23 is longer than the bottom panel 21. A handle portion 25 is defined at the free end of the top panel 23.

Figure 2:
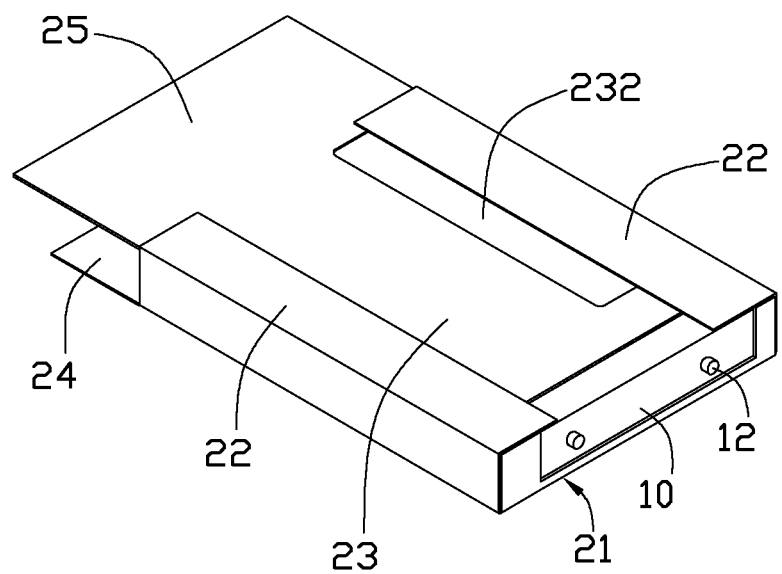
FIG. 2 is an assembled view of the solid state disk module of FIG. 1.

Referring to FIG. 2, the solid state disk 10 is positioned on the bottom panel 21 of the fixing structure 20. The top panel 23 bends to cover the end of the solid state disk 10 and the top surface of the solid state disk 10. In other words, the top panel 23 is located over the bottom panel 21 of the fixing structure 20. The ports 12 protrude through the hole 230 and are exposed outside the hole 230. The handle portion 25 extends beyond an end of the top surface of the solid state disk 10. The two lateral panels 22 also bend to cover a part of the top surface of the solid state disk 10, and are secured on the top panel 23 of the fixing structure 20 by the adhesive material 30. The securing panel 24 and the handle portion 25 can be adhered together by the adhesive material 30 on the securing panel 24 (see FIG. 3). That is, for facilitating operation of the fixing structure 20, the handle portion 25 extends over the securing panel 24.

Figure 3:
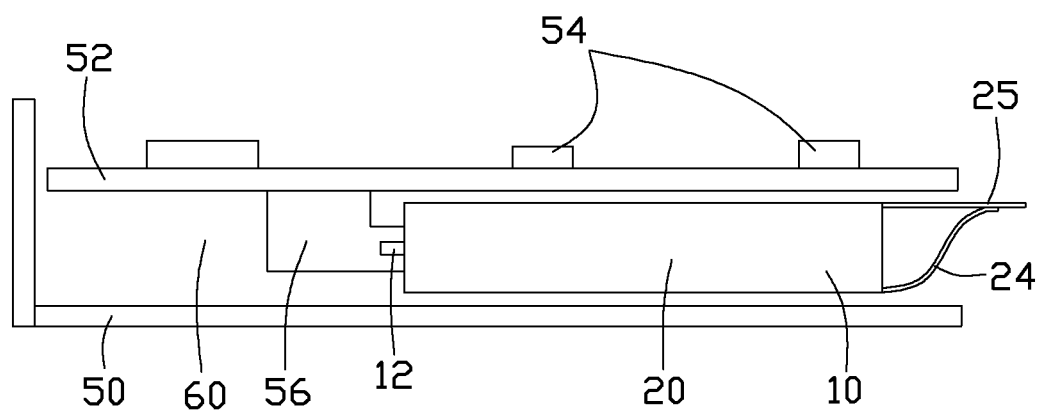
FIG. 3 is a schematic side view of the solid state disk module of FIG. 2 installed in an electronic device.

Referring to FIG. 3, an electronic device in accordance with an embodiment of the present disclosure comprises a shell 50, a printed circuit board 52 embedded in the shell 50, and the above-described solid state disk module mounted on the printed circuit board 52.

The electronic device can be a server. The printed circuit board 52 is secured on a plate such as a bottom plate of the shell 50. A plurality of electronic elements 54 are formed on a top surface of the printed circuit board 52. A tiny gap 60 is defined between the shell 50 and a bottom surface of the printed circuit board 52. The solid state disk module is capable of being received in the gap 60 due to the small space occupied by the solid state disk module. A cable 56 is formed on the bottom surface of the printed circuit board 52 to connect with the ports 12 of the solid state disk 10. It is noted that in alternative embodiments, the cable 56 can be formed on the top surface of the printed circuit board 52, or at other suitable positions in the shell 50 where a receiving space suitable for the solid state disk module is provided.

In assembly of the solid state disk module into the electronic device, the solid state disk module (i.e., the combined solid state disk 10 with the fixing structure 20 encapsulation) is pushed into the gap 60 to obtain a connection between the cable 56 and the ports 12. In disassembly, the solid state disk module can be removed from the electronic device by pulling the handle portion 25. To facilitate the operation, the handle portion 25 is long enough to extend outside of the shell 50.

Compared with conventional fixing structures, the fixing structure 20 for the solid state disk 10 of the present disclosure is simple in construction and easy to operate. The solid state disk 10 can be encapsulated in the fixing structure 20 just by bending and folding the lateral panels 22 and the top panel 23.

In addition, the fixing structure 20 is small. Furthermore, unlike with conventional fixing structures, the fixing structure 20 made of insulating material does not need an additional insulating plate embedded therein.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A solid state disk module comprising:
    a solid state disk having two opposite lateral sides, and comprising ports at one end thereof; and
    a fixing structure encapsulating the solid state disk, the fixing structure comprising a bottom panel, two lateral panels extending from two lateral sides of the bottom panel, and a top panel extending from one end of the bottom panel;
    wherein the solid state disk is positioned on the bottom panel, the top panel is bent from the bottom panel and covers the end and a top of the solid state disk, the lateral panels are bent from the bottom panel and cover the lateral sides of the solid state disk and connect to the top panel, a portion of the top panel which covers the end of the solid state disk has a hole defined therein, the ports of the disk are exposed through the hole, and the top panel comprises a handle portion extending beyond the top of the solid state disk.

2. The solid state disk module of claim 1, wherein adhesive material is provided on the lateral panels for adhering the lateral panels and the top panel together.

3. The solid state disk module of claim 1, wherein the fixing structure further comprises a securing panel extending from an opposite end of the bottom panel, and adhesive material is provided on the securing panel for adhering the securing panel and the handle portion together.

4. The solid state disk module of claim 3, wherein the handle portion extends over the securing panel.

5. The solid state disk module of claim 1, wherein a label portion is defined on the solid state disk, and a window is defined in the top panel for exposing the label portion.

6. The solid state disk module of claim 1, wherein the fixing structure is integrally made as a single monolithic piece of insulating material.

7. An electronic device comprising:
    a shell;
    a printed circuit board provided in the shell, a cable extending from the printed circuit board;
    a solid state disk having two opposite lateral sides, and comprising ports at one end thereof, the ports connecting with the cable; and
    a fixing structure encapsulating the solid state disk, the fixing structure comprising a bottom panel, two lateral panels extending from two lateral sides of the bottom panel, and a top panel extending from one end of the bottom panel;
    wherein the solid state disk is positioned on the bottom panel, the top panel is bent from the bottom panel and covers the end and a top of the solid state disk, the lateral panels are bent from the bottom panel and cover the lateral sides of the solid state disk and connect to the top panel, a portion of the top panel which covers the end of the solid state disk has a hole defined therein, the ports of the disk are exposed through the hole, and the top panel comprises a handle portion extending beyond the top of the solid state disk.

8. The electronic device of claim 7, wherein the fixing structure is integrally made as a single monolithic piece of insulating material.

9. The electronic device of claim 7, wherein the fixing structure further comprises a securing panel extending from an opposite end of the bottom panel, and adhesive material is provided on the securing panel for adhering the securing panel and the handle portion.

10. The electronic device of claim 9, wherein the handle portion extends over the securing panel.

11. The electronic device of claim 7, wherein the handle portion extends outside of the shell.

12. The electronic device of claim 7, wherein adhesive material is provided on the lateral panels for adhering the lateral panels and the top panel together.

13. The electronic device of claim 7, wherein a label portion is defined on the solid state disk, and a window is defined in the top panel for exposing the label portion.

14. The electronic device of claim 7, wherein a gap is defined between the printed circuit board and the shell, the solid state disk is received in the gap.

15. A solid state disk module comprising:
    a solid state disk having two opposite lateral sides, and comprising a plurality of ports at a rear end thereof;
    a fixing structure integrally made as a single monolithic piece of insulating material and encapsulating the solid state disk, the fixing structure comprising a bottom panel, two lateral panels extending from two lateral sides of the bottom panel, and a top panel extending from a rear end of the bottom panel; and
    adhesive material provided on the lateral panels;
    wherein the solid state disk is positioned on the bottom panel, the top panel is bent from the bottom panel and covers the rear end and a top of the solid state disk, the lateral panels are bent from the bottom panel and cover the lateral sides of the solid state disk and are adhered to the top panel via the adhesive material, a portion of the top panel which covers the rear end of the solid state disk has a hole defined therein, the ports of the solid state disk are exposed through the hole, and the top panel comprises a handle portion extending beyond the top of the solid state disk.

16. The solid state disk module of claim 15, wherein the fixing structure further comprises a securing panel extending from an opposite front end of the bottom panel, and another adhesive material is provided on the securing panel for adhering the securing panel and the handle portion.

17. The solid state disk module of claim 16, wherein the handle portion extends over the securing panel.

18. The solid state disk module of claim 15, wherein a label portion is defined on a top of the solid state disk, and a window is defined in the top panel for exposing the label portion.

* * * * *